US008432381B2

(12) United States Patent
Shibusawa

(10) Patent No.: US 8,432,381 B2
(45) Date of Patent: Apr. 30, 2013

(54) ACTIVE MATRIX DISPLAY

(75) Inventor: Makoto Shibusawa, Fukaya (JP)

(73) Assignee: Japan Display Central Inc., Fukaya-shi (JP)

( * ) Notice: Subject to any disclaimer, the term of this patent is extended or adjusted under 35 U.S.C. 154(b) by 821 days.

(21) Appl. No.: 12/566,022

(22) Filed: Sep. 24, 2009

(65) Prior Publication Data
US 2010/0079419 A1    Apr. 1, 2010

(30) Foreign Application Priority Data
Sep. 30, 2008    (JP) .................... 2008-254526

(51) Int. Cl.
*G06F 3/038*    (2006.01)
*G09G 5/00*    (2006.01)

(52) U.S. Cl.
USPC ............................................. 345/204

(58) Field of Classification Search .............. None
See application file for complete search history.

(56) References Cited

U.S. PATENT DOCUMENTS

| 7,009,591 | B2 | 3/2006 | Shibusawa |
| 7,333,079 | B2 | 2/2008 | Shibusawa et al. |
| 7,940,343 | B2 * | 5/2011 | Teranishi et al. ............... 349/38 |
| 2005/0212448 | A1 | 9/2005 | Shibusawa |
| 2006/0001618 | A1 * | 1/2006 | Shin ................................. 345/76 |
| 2006/0244696 | A1 * | 11/2006 | Jung et al. ........................ 345/77 |
| 2006/0279499 | A1 * | 12/2006 | Park et al. ........................ 345/92 |
| 2008/0143655 | A1 * | 6/2008 | Ko .................................... 345/82 |
| 2008/0224991 | A1 * | 9/2008 | Chiou et al. .................. 345/107 |
| 2008/0297055 | A1 * | 12/2008 | Miyake et al. ............. 315/169.2 |

FOREIGN PATENT DOCUMENTS
JP    2007-10993    1/2007

\* cited by examiner

*Primary Examiner* — Lixi C Simpson
(74) *Attorney, Agent, or Firm* — Oblon, Spivak, McClelland, Maier & Neustadt, L.L.P.

(57) ABSTRACT

An active matrix display includes a substrate, a video signal line on the substrate, first and second power lines on the substrate, a self-emitting element having two display electrodes facing each other and connected to one of the first and second power lines, a drive transistor connected between the first power line and one of the display electrodes, a storage capacitor having a first electrode connected to a gate electrode of the drive transistor and a second electrode facing the first electrode with interposing an insulating layer, the storage capacitor and the gate electrode of the drive transistor being arranged under the display electrode, and a shield electrode arranged between the display electrode connected to the drive transistor and at least one of the first electrode of the storage capacitor and the gate electrode with interposing an insulating layer, and set at a constant potential.

4 Claims, 10 Drawing Sheets

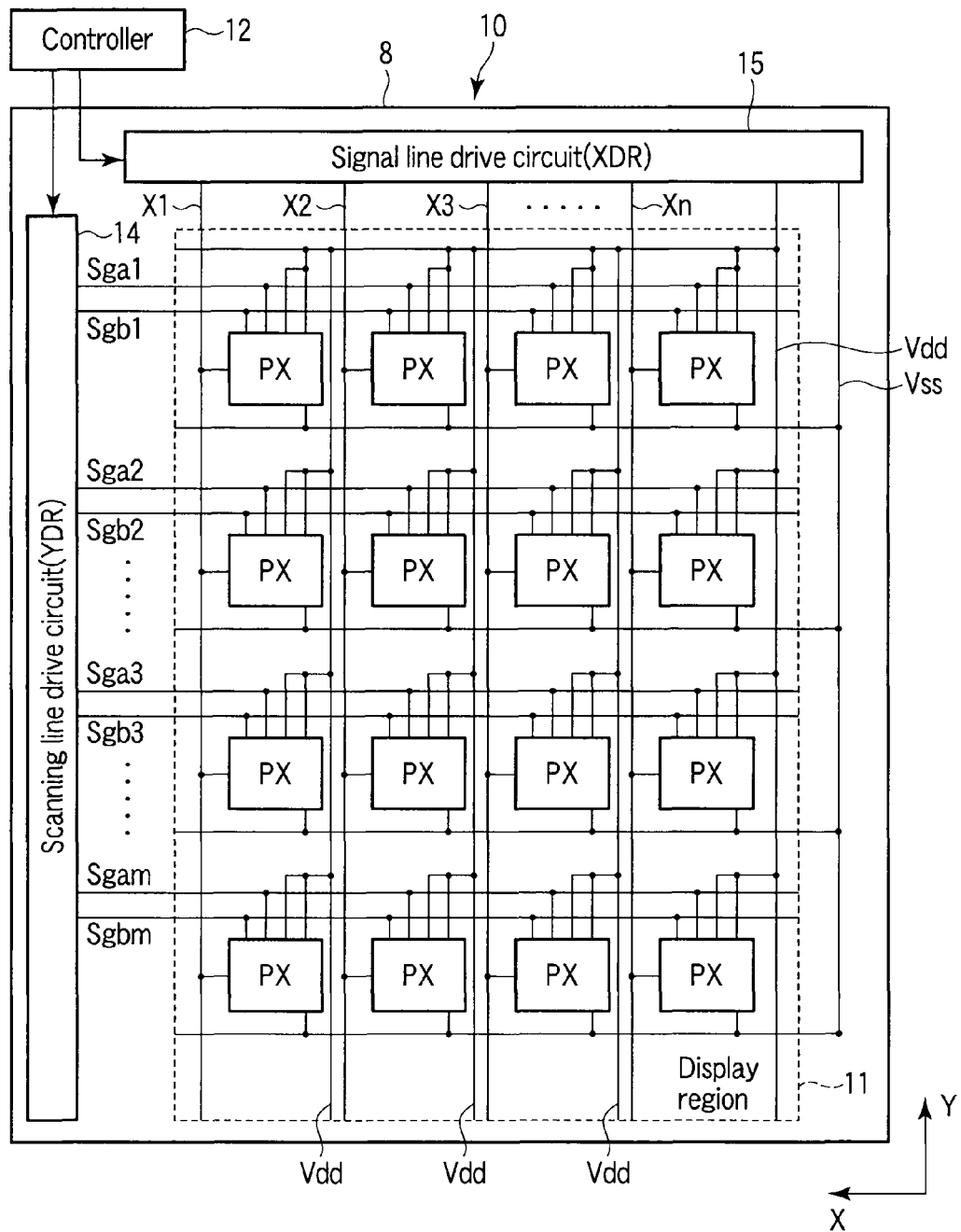
F I G. 1

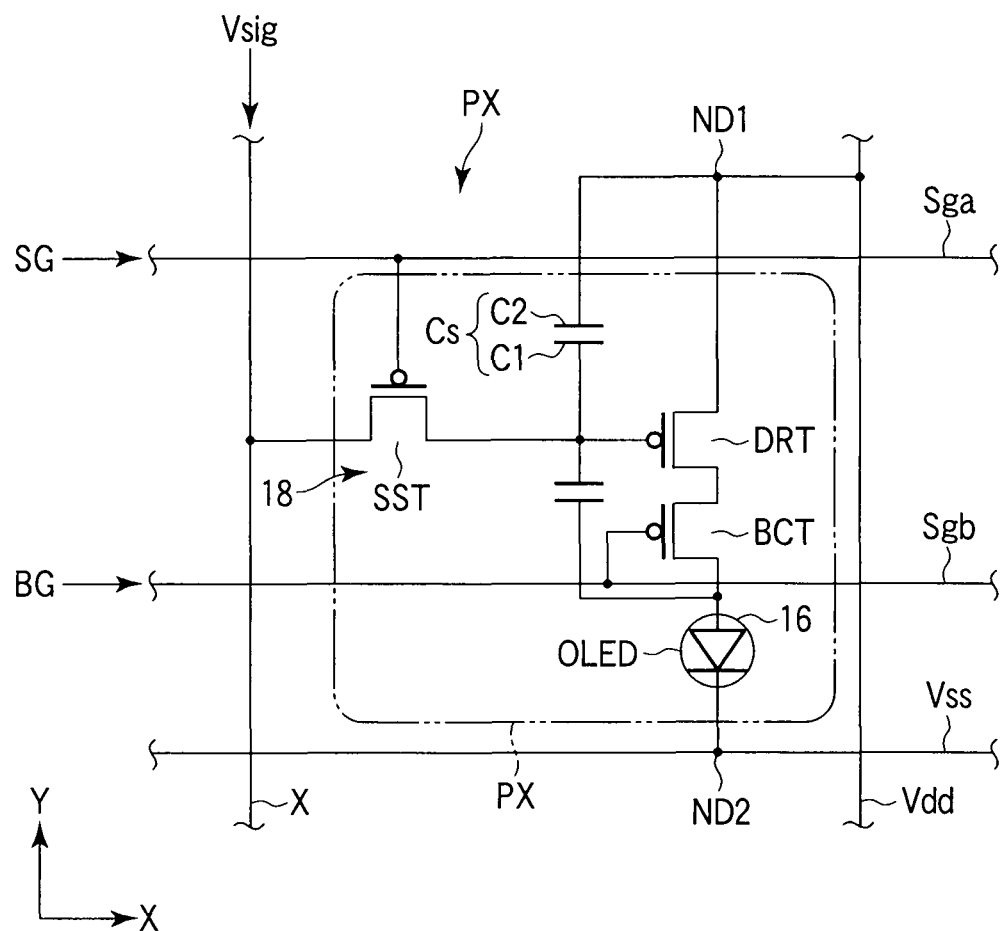
F I G. 2

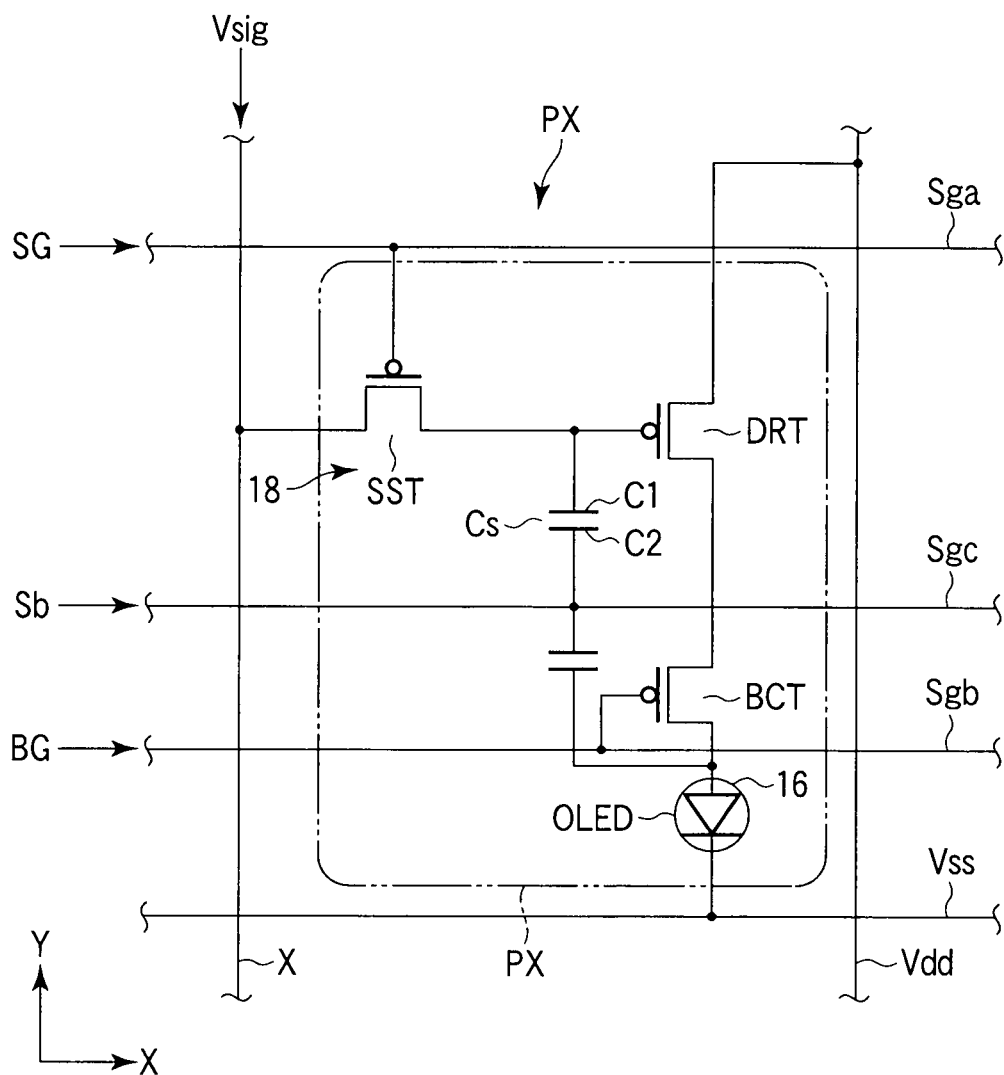
F I G. 5

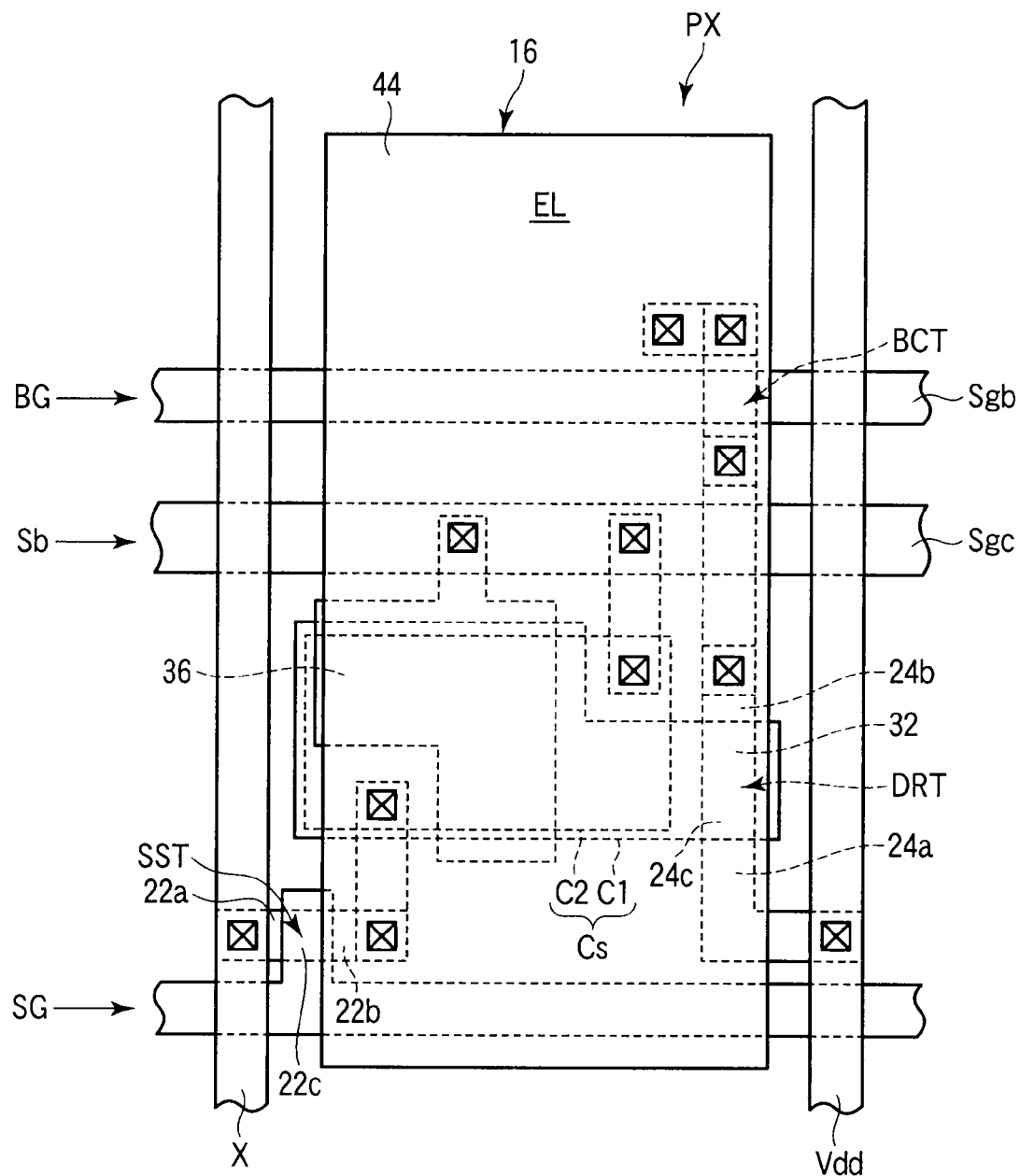
F I G. 6

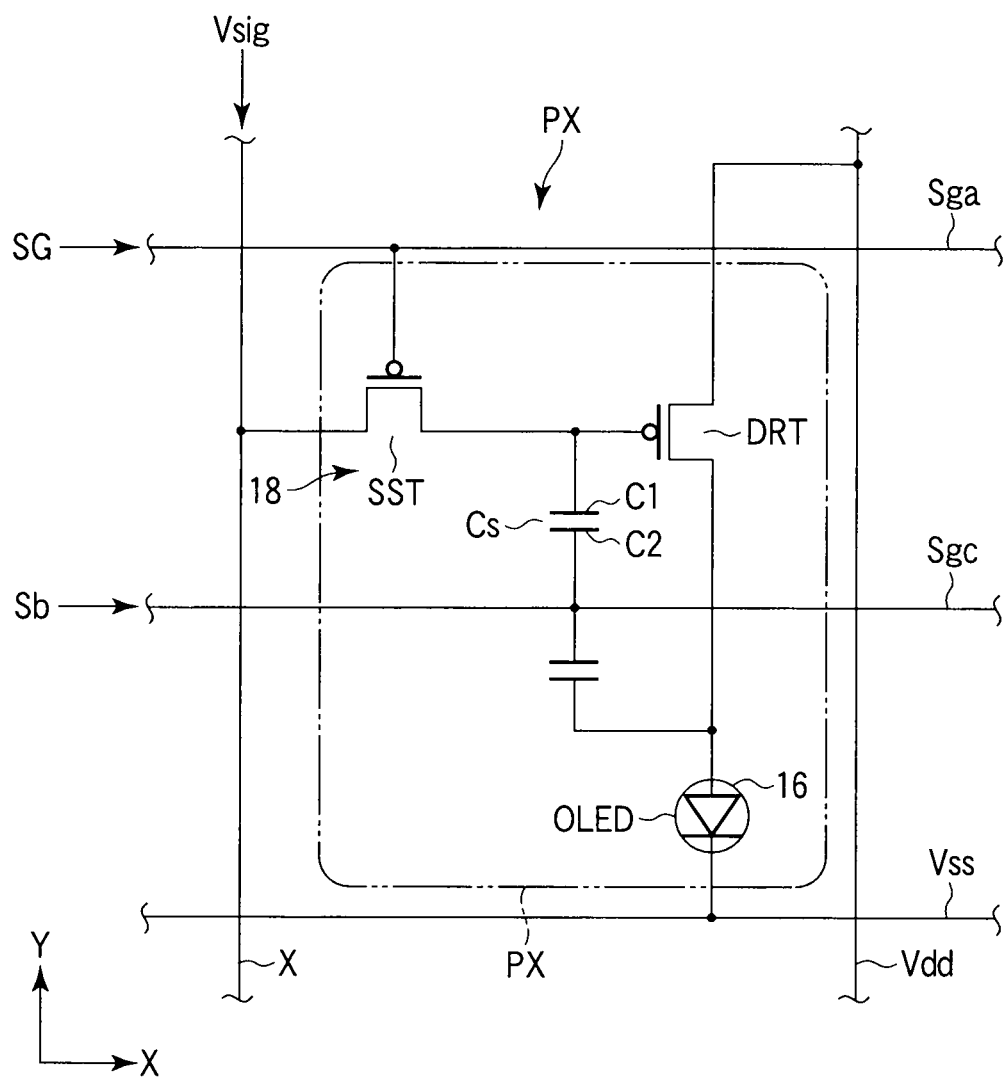
F I G. 7

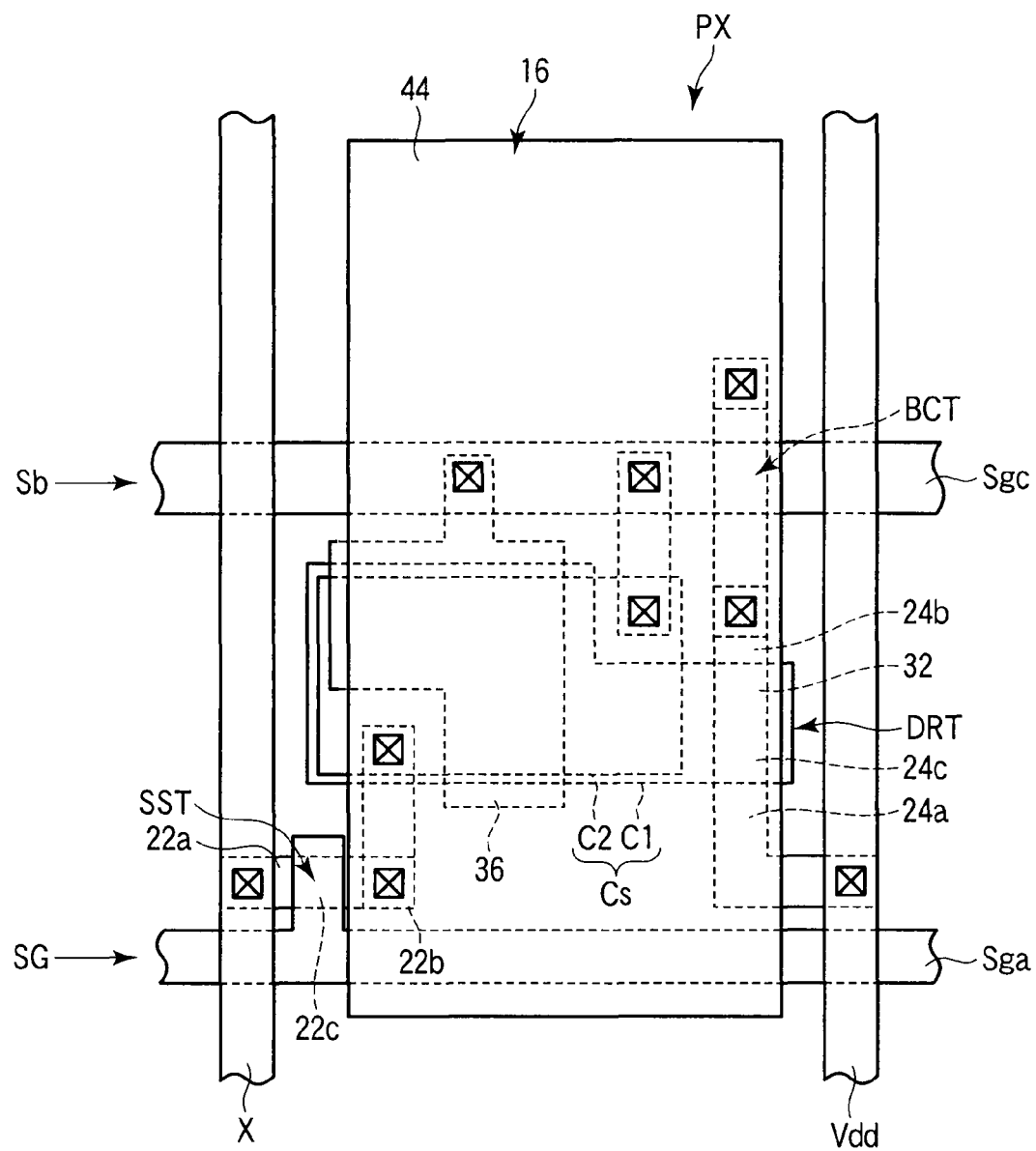
F I G. 8

ACTIVE MATRIX DISPLAY

CROSS-REFERENCE TO RELATED APPLICATIONS

This application is based upon and claims the benefit of priority from prior Japanese Patent Application No. 2008-254526, filed Sep. 30, 2008, the entire contents of which are incorporated herein by reference.

BACKGROUND OF THE INVENTION

1. Field of the Invention

This invention relates to an active matrix display including a light-emitting device.

2. Description of the Related Art

Recently, in the field of active matrix displays, attention has been paid to organic electroluminescence (EL) displays using self-luminous elements, on which research and development is conducted actively. For example, an organic EL display disclosed in Jap. Pat. Appln. KOKAI Publication No. 2007-10993 comprises a plurality of pixels arranged in a plurality of lines and rows on a substrate and forming a display screen, and a plurality of video signal lines connected to the respective pixels. Each pixel is formed of an organic EL device, which is a self-light emitting element, and a pixel circuit which supplies a driving current to the organic EL device, and performs a display operation by controlling luminous brightness of the organic EL device.

The pixel circuit includes a drive transistor formed of a thin-film transistor (hereinafter referred to as TFT), an organic EL device, a capacitor, and a switching transistor, for example. The drive transistor and the organic EL device are connected in series in this order between a high-voltage power line and a low-voltage power line. The capacitor is connected to a gate of the drive transistor. The switching transistor is connected between the video signal line, and the capacitor and the gate of the drive transistor. An output switch is provided between the drive transistor and the organic EL device.

To let an organic EL diode (hereinafter referred to as OLED) as the organic EL device emit light, a driving current according to a video signal is supplied from the drive transistor to let the OLED emit light at a brightness level determined according to the driving current.

Since OLEDs deteriorate in luminous efficiency with time approximately proportional to current density, the brightness level gradually decreases. To moderate the decrease in brightness level with time, a design approach to increase the area and decrease the current density if OLEDs has been developed.

In bottom-emission displays as organic EL displays which capture light from the substrate side on which pixels are formed, schemes to obtain light from a void between elements such as TFTs have been devised. Further, in top-emission displays which capture light to the side opposite to the substrate on which pixels are formed, schemes to eliminate limitations on arrangement of elements on a substrate upon formation of OLEDs have been devised.

For example, an OLED is arranged over a circuit element such as a TFT. A problem with this case is that a desired white brightness cannot be obtained, although the area of the OLED can be increased. Factors of this problem include increase in parasitic capacity due to overlap between a gate of a drive transistor or an electrode electrically equivalent to this gate and an anode of the OLED over a large area.

That is, increase in parasitic capacitance causes propagation of change in potential of the gate of the drive transistor over change in potential of the anode of the OLED. The amount of displacement of the anode potential of the OLED is large when an output switch is turned on. Immediately before the output switch is turned on (when writing is finished), the anode potential of the OLED is equivalent to a threshold voltage of the OLED, and a gate potential of the drive transistor is at a predetermined potential determined according to a video signal. When the output switch is turned on, a voltage is applied to the OLED and the anode potential increases, and thereby the OLED emits light.

The parasitic capacitance also increases the gate potential of the drive transistor (in an off direction) with increase in anode potential, and thereby a current supplied to the OLED decreases and the OLED will emit light with a brightness lower than a desired brightness. Further, change in anode potential of an OLED when an output switch is turned on decreases as the brightness becomes lower and increases as the brightness becomes higher. Accordingly, the parasitic capacitance will also lose a dynamic range of the video signal voltage.

BRIEF SUMMARY OF THE INVENTION

According to an aspect of the invention, there is provided an active matrix display comprising: a substrate; a video signal line formed on the substrate; a plurality of control lines including a first power line and a second power line provided on the substrate; a self-emitting element having two display electrodes facing each other and connected to one of the first power line and the second power line; a drive transistor connected between the first power line and one of the two display electrodes of the self-emitting element and having a gate electrode; a storage capacitor having a first electrode connected to the gate electrode of the drive transistor and a second electrode facing the first electrode with interposing an insulating layer and configured to store a control potential of the gate electrode corresponding to a video signal supplied from the video signal line, at least one of the storage capacitor and the gate electrode of the drive transistor being arranged under the display electrode connected to the drive connector; and a shield electrode arranged between the display electrode connected to the drive transistor and at least one of the first electrode of the storage capacitor and the gate electrode of the drive transistor with interposing an insulating layer, and set at a constant potential.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a plan view schematically illustrating an organic EL display according to a first embodiment of the present invention;

FIG. 2 is an equivalent circuit diagram of a display pixel in the organic EL display;

FIG. 5 is an equivalent circuit diagram of a display pixel of an organic EL display according to a second embodiment of the present invention;

FIG. 6 is a plan view schematically illustrating a display pixel of an organic EL display according to the second embodiment;

FIG. 7 is an equivalent circuit diagram of a display pixel of an organic EL display according to a third embodiment of the present invention;

FIG. 8 is a plan view schematically illustrating a display pixel of the organic EL display according to the third embodiment;

DETAILED DESCRIPTION OF THE INVENTION

Figure 3:
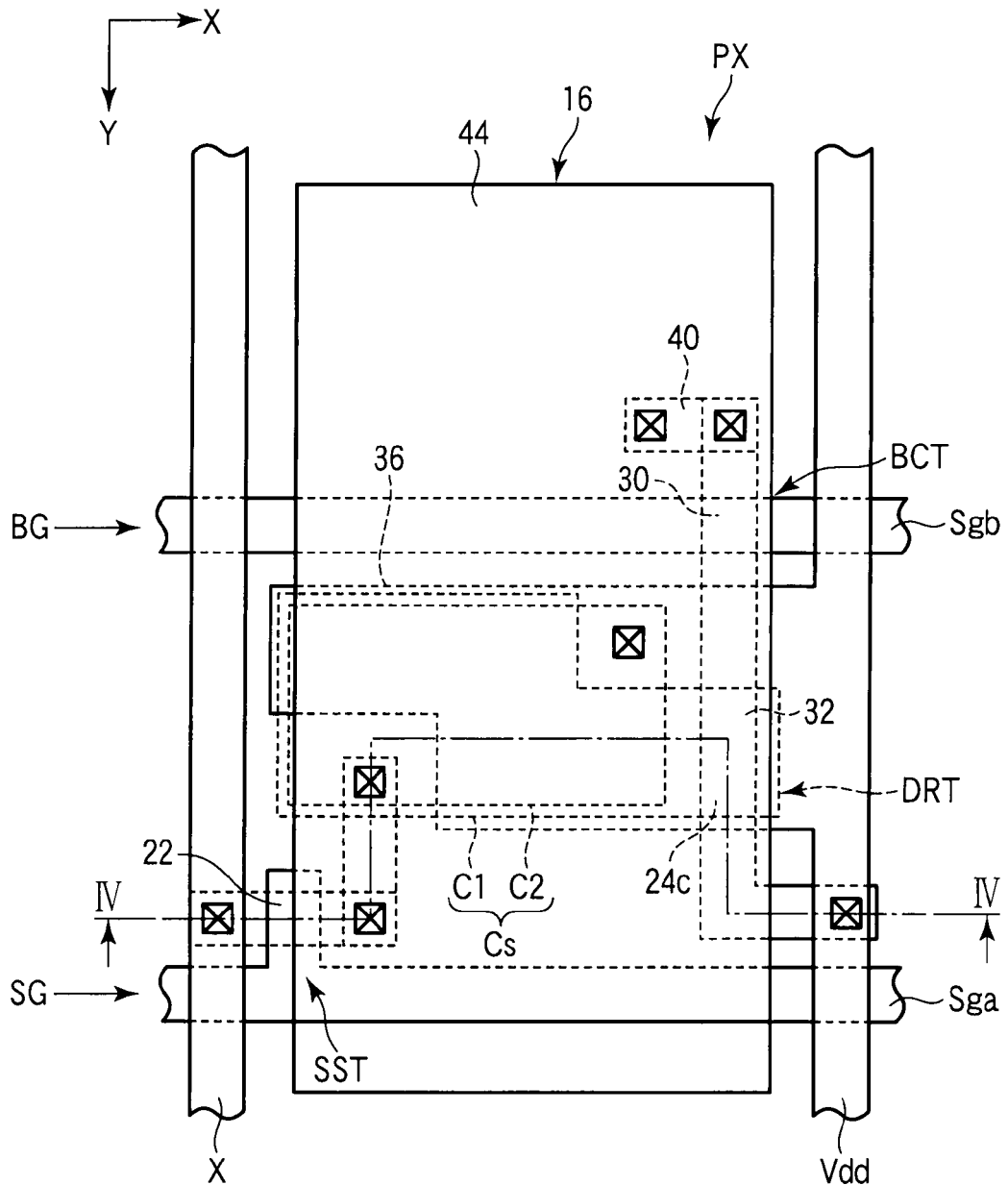
FIG. 3 is a plan view schematically illustrating the display pixel.

Hereinafter, embodiments in which an active matrix display according to the present invention is applied to an organic EL display will be described in detail with reference to the accompanying drawings.

FIG. 1 is a plan view schematically illustrating an organic EL display according to the first embodiment of the present invention. As shown in FIG. 1, a display is a top-emission organic EL display which adopts the active matrix driving scheme. This display includes a display panel 10 and a controller 12 which controls operations of the display panel 10.

The display panel 10 includes an insulating substrate 8 having optical transparency such as a glass plate, m by n display pixels PX arranged as a matrix on the insulating substrate 8 and forming a display region 11, m first scanning lines (gate wiring for controlling signal writing) Sga (1-$m$) and m second scanning lines (gate wiring for controlling EL emission) Sgb (1-$m$) connected to the respective rows of the display pixels and provided independently, and n video signal lines X (1-$n$) connected to the respective lines of the display pixels PX. The video signal lines X extend in a direction Y (first direction), respectively, and the scanning lines sga1 to sgbm extend in a direction X (second direction) perpendicular to the direction Y, respectively.

The organic EL display panel 10 comprises a scanning line drive circuit 14 which sequentially drives the first and second scanning lines Sga (1-$m$) and Sgb (1-$m$) according to the lines of the display pixels PX, and a signal line drive circuit 15 which drives a plurality of video signals lines X (1-$n$). The scanning line drive circuit 14 and the signal line drive circuit 15 are integrally formed on the insulating substrate 8 outside of the display region 11, and form a control unit together with a controller 12. The scanning line drive circuit 14 and the signal line drive circuit 15 are mounted on the display panel 10 through chip on glass (COG). The scanning line drive circuit 14 and the signal line drive circuit 15 may be mounted through tape carrier package (TCP) instead of COG.

The organic EL display panel 10 has a plurality of high-voltage voltage power lines Vdd as first power lines and a low-voltage reference voltage power line Vss as second power lines. The high-voltage voltage power lines Vdd extend in the direction Y along the respective lines of the display pixels PX. The voltage power lines Vdd and the reference voltage power line Vss are set at potentials of +5V and −3V, respectively. The voltage power line Vdd and the reference voltage power line Vss are connected to the signal line drive circuit 15, and receive a power voltage supplied from the signal line drive circuit.

FIG. 2 illustrates an equivalent circuit of the display pixel PX. As shown in FIGS. 1 and 2, each display pixel PX which functions as a pixel part comprises an emitting element including a photoactive layer between counter electrodes and a pixel circuit 18 which supplies a driving current to the emitting element. The emitting element is a self-light emitting element, for example, and the present embodiment uses an organic EL element 16 including at least an organic light-emitting layer as a photoactive layer.

The pixel circuit 18 is a pixel circuit of a voltage signal system, in which light emission of the organic EL element 16 is controlled according to a video signal formed of a voltage signal, for example, and includes a pixel switch SST, a drive transistor DRT, a storage capacitor Cs as a capacitor, and an output switch BCT.

In this case, the pixel switch SST, the drive transistor DRT, and the output switch BCT are formed of thin-film transistors of the same conductity type, such as P-channel. In the present embodiment, all the thin-film transistors forming the drive transistors and the switches are thin-film transistors of top-gate structures formed by the same process with the same laminar structure and using polysilicon in semiconductor layers.

Each of the pixel switch SST, the drive transistor DRT, and the output switch BCT, has a first terminal, a second terminal and a control terminal, and the present embodiment refers to the first terminal, the second terminal, and the control terminal as a source, a drain, and a gate, respectively.

In the pixel circuit 18, the drive transistor DRT and the output switch BCT are connected in series to the organic EL element 16 between a high-voltage voltage power line Vdd and a low-voltage reference voltage power line Vss, and a driving current of an amount according to a video signal is output to the organic EL device. In this case, the source of the drive transistor DRT is connected to the voltage power line Vdd and the drain of the drive transistor DRT is connected to one of the other electrodes, such as the anode, of the organic EL element 16.

The source of the output switch BCT is connected to the drain of the drive transistor DRT, the drain of the output switch BCT is connected to one of the electrodes, the anode in this case, of the organic EL element 16, and the gate of the output switch BCT is connected to the second scanning line Sgb (1-$m$). The output switch BCT is controlled to be turned on (conductive state) or off (non-conductive state) by a control signal BG (1-$m$) from the second scanning line Sgb (1-$m$), and controls the drive transistor DRT and the organic EL element 16 to be connected or disconnected.

The source of the pixel switch SST is connected to the video signal line X (1-$n$), and the drain of the pixel switch SST is connected to the gate of drive transistor DRT. The gate of the pixel switch SST is connected to the first scanning line Sga (1-$m$) and controlled to be turned on or off by a control signal SG (1-$m$) supplied from the first scanning line Sga (1-$m$). In response to the control signal SG (1-$m$), the pixel switch SST controls the pixel circuit 18 and the video signal line X (1-$n$) to be connected or disconnected, and captures a gray-scale video voltage signal from a corresponding video signal line X (1-$n$) to the pixel circuit 18.

The storage capacitor Cs has a pair of plate-shaped upper electrode C1 and lower electrode C2 facing each other with an insulating layer interposed therebetween. The upper electrode C1 is connected to a gate of the drive transistor DRT, and the lower electrode C2 is connected to the high-voltage voltage power line Vdd. The storage capacitor Cs retains a gate control potential of the drive transistor determined by a video signal written through the pixel switch SST. The pixel circuit 18 is arranged between the storage capacitor Cs and the organic EL element 16, and includes a shield electrode which insulates them.

Next, a deposition structure and a deposition pattern of the display pixel PX will be described in detail. FIG. 3 is a plan view of the display pixel PX, and FIG. 4 is a cross-sectional view of the display pixel taken along line IV-IV of FIG. 3.

Figure 4:
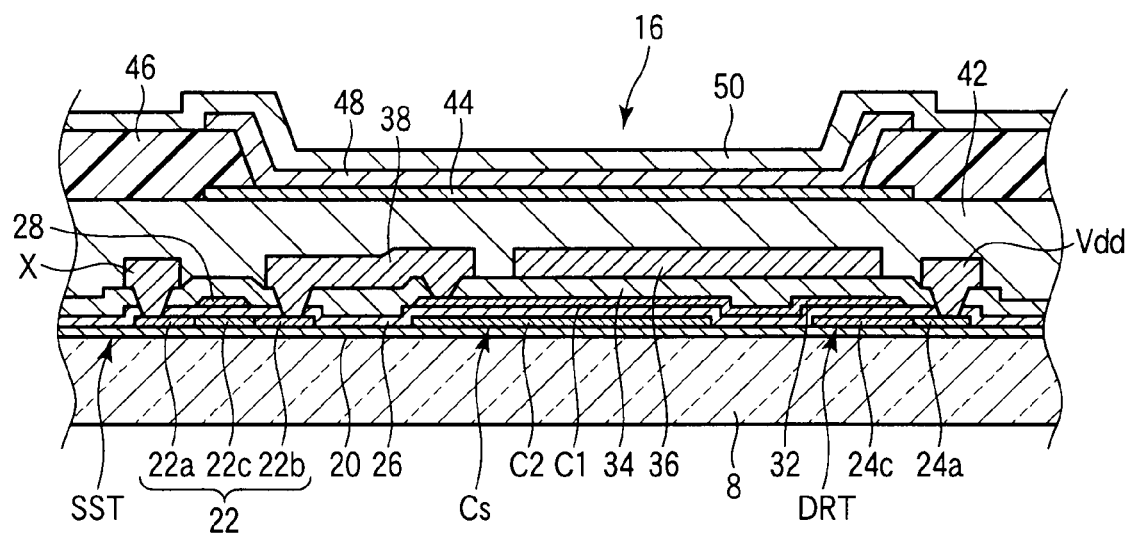
FIG. 4 is a cross-sectional view of a display panel taken along line IV-IV of FIG. 3.

As shown in FIGS. 3 and 4, an undercoat layer 20 is formed on a surface of a substrate 8 of the display panel 10. The undercoat layer 20 is formed by sequentially laminating a $SiN_X$ layer and a $SiO_X$ layer in this order, for example.

A semiconductor layer formed of polysilicon, for example, is formed on the undercoat layer 20, and the semiconductor layer is patterned to form channel layers of the pixel switch SST, the drive transistor DRT, and the output switch BCT, and the lower electrode C2 of the storage capacitor Cs. Each of the channel layers, a channel layer 22, for example, of the pixel switch SST includes a source region 22a, a drain region 22b, and a channel region 22c located between the source and drain regions. Similarly, a channel layer 24 of the drive transistor DRT includes a source region 24a, a drain region, and a channel region 24c located between the source and drain regions. The lower electrode C2 of the storage capacitor Cs is an $n^+$ polysilicon layer, for example.

A gate insulating film 26 is formed on the channel layer and the lower electrode C2. The gate insulating film 26 is an $SiO_X$ film having a dielectric constant of 4 and a film thickness of 100 nm, for example.

A conductive film formed of MoW, for example, is formed on the gate insulating film 26, and the conductive film is patterned to form the first scanning line Sga (1-m), the second scanning line Sgb (1-m), and the upper electrode C1 of the storage capacitor Cs.

The first scanning line Sga projects orthogonally in a plurality of portions, each of which forms a gate electrode 28 of the pixel switch SST. The gate electrode 28 faces the channel region 22c via the gate insulating film 26. The second scanning line Sgb extends partially overlapping with the channel layer 30 of the output switch BCT to form a gate electrode of the output switch BCT.

The upper electrode C1 is arranged to face most of the upper electrode C2 interposing the gate insulating film 26, i.e., leaving a clearance. The upper electrode C1, the lower electrode C2, and the gate insulating film 26 interposed therebetween, forms the storage capacitor Cs. An end of the upper electrode C1 extends over the channel layer 24 of the drive transistor DRT to form a gate electrode 32 of the drive transistor DRT.

An interlayer insulating film 34 is formed on the gate insulating film 26, the first scanning line Sga (1-m), the second scanning line Sgb (1-m), and the upper electrode C1. The interlayer insulating film 34 is formed of $SiO_X$ deposited by the plasma CVD method, for example. In this case, the interlayer insulating film 34 is an $SiO_X$ film having a dielectric constant of 4, and a film thickness of 400 nm.

A conductive film is formed on the interlayer insulating film 34, and the conductive film is patterned to form the video signal line X (1-n), the voltage power line Vdd as the first power wiring, the reference voltage power line Vss as the second power wiring, the shield electrode 36, and a plurality of drain electrodes 38, 40. This conductive film has a three-layered structure of Mo/Al/Mo, for example.

The video signal lines X (1-n) extend in Y direction and are arranged at predetermined intervals in X direction. The video signal lines X (1-n) are connected to the source region 22a of the pixel switch SST via contact holes provided in the interlayer insulating film 34 and the gate insulating film 26. One end of the drain electrode 38 of the pixel switch SST is connected to the drain region 22b of the pixel switch SST via contact holes provided in the interlayer insulating film 34 and the gate insulating film 26, and the other end is connected to the upper electrode C1 of the storage capacitor Cs via the contact hole provided in the interlayer insulating film 34.

An end of the drain electrode 40 of the output switch BCT is connected to the drain region of the output switch BCT via the contact holes provided in the interlayer insulating film 34 and the gate insulating film 26.

The voltage power lines Vdd extend in Y direction and are arranged at predetermined intervals in X direction. The voltage power lines Vdd are partially connected to the source region 24a of the drive transistor DRT via contact holes formed in the interlayer insulating film 34 and the gate insulating film 26.

The shield electrode 36 is arranged above and faces most of the upper electrode C1 of the storage capacitor Cs and the gate electrode 32 of the drive transistor DRT, interposing the interlayer insulating film 34. In the present embodiment, the shield electrode 36 is integrally formed with the high-potentnial voltage power line Vdd, that is, formed by partially extending the voltage power line Vdd. The shield electrode 36 extends in the direction X perpendicular to the direction Y from the power line Vdd. Thereby, the shiled electrode 36 and the voltage power line Vdd can be set at a common potential. The shield electrode 36 includes a first section connected to the power line Vdd and having a first width in the direction Y, and a second section located on the side of the video signal line X and having a second width smaller than the first width. The shield electrode 36 is connected to the lower electrode C2 via the contact holes formed in the interlayer insulating film 34 and the gate insulating film 26.

The interlayer insulating film 34, the video signal line (1-n), the voltage power line Vdd, the reference voltage power line Vss, the drain electrodes 38, 40, and the shield electrode 36 are coated with a passivation film 42. The passivation film 42 is an organic insulating film having a dielectric constant of 3 and a film thickness of 2 μm, for example. The passivation film 42 also functions as a planarization film.

A plurality of organic EL elements 16 are formed on the passivation film 42. Each of the organic EL elements 16 has a back electrode 44 formed on the passivation film 42 and having light reflectivity, for example. The back electrode 44 forms an anode, for example, of the organic EL element 16. The back electrode 44 is formed over a wide range between the video signal line X and the voltage power line Vdd, above the storage capacitor Cs, the drive transistor, the output switch BCT, and the first and second scanning lines Sga, Sgb. The back electrode 44 is formed in a rectangular and has long sides extending in the direction Y and short sides extending in the direction X. The back electrode 44 is connected to the drain electrode 40 of the output switch BCT via the contact hole formed in the passivation film 42.

A barrier insulating layer 46 formed of an organic insulating layer, for example, is formed on the passivation film 42. A portion of the barrier insulating layer 46 that faces the back electrode 44 is removed by etching, for example to form a through hole or a slit.

An organic light-emitting layer 48, which includes a luminescent organic compound that emits red, green, or blue, is formed on an approximately entire surface of the back electrode 44. The organic light-emitting layer 48 may further include a hole injection layer, a hole transport layer, a hole blocking layer, an electron transport layer, and an electron injection layer as well as the light-emitting layer.

A front electrode 50 is formed on the barrier insulating layer 46 and the organic light-emitting layer 48. In this example, the front electrode 50 is formed as an electrode to which a plurality of display pixels PX are connected, that is, as a common electrode, and forms an anode of the emitting element 16. The front electrode 50 is formed of a transparent conductive material such as indium tin oxide (ITO), and has optical transparency. The front electrode 50 is electrically connected to the reference voltage power line Vss via the contact holes formed in the passivation film 42 and the barrier insulating layer 46, for example. Thus, the organic EL element 16 has a structure in which the organic light-emitting layer 48 is interposed between the back electrode (cathode) 44 and the front electrode (anode) 50.

In the organic EL element 16 with the above-described structure, when the holes injected from the front electrode (anode) 50 and the electrons injected from the back electrode (cathode) 44 are recombined inside the organic light-emitting layer 48, organic molecules forming the organic light-emitting layer are excited to generate excitons. The excitons emit light in the process of radiative deactivation, and the emitted light is released to the outside through the transparent front electrode 50 from the organic light-emitting layer 48.

The voltage power line PL sets a node ND1 of the voltage power line PL at a high-level constant potential. The reference voltage power line RL sets a node ND2 of a counter electrode CE at a low-level constant potential. Accordingly, the node ND1 is a high-voltage power terminal as a first power terminal, and the node ND2 is a low-voltage power terminal as a second power terminal.

As shown in FIGS. 3 and 4, the above-described shield electrode 36 is arranged between the back electrode 44 and the gate electrode 32 and the upper electrode C1, in a region in which the back electrode 44 connected to the drive transistor DRT, the gate electrode 32 of the drive transistor DRT, and the upper electrode C1 of the storage capacitor CS electrically connected to the gate electrode 32 overlap with each other interposing the passivation film 42, and faces the gate electrode 32 and the upper electrode C1 interposing the insulating layer. The shield electrode 36 is set at a constant potential, a constant potential common to the shield electrode 36 and the high-voltage voltage power line Vdd in this case.

Next, a light-emitting operation of the organic EL display with the above-described configuration will be described.

As shown in FIG. 1, the controller 12 is formed on a printed circuit board arranged outside of the display panel 10, and controls the scanning line drive circuit 14 and the signal line drive circuit 15. The controller 12 receives digital video signal and synchronization signal supplied from the outside and generates a vertical scanning control signal for controlling vertical scanning timing and a horizontal scanning control signal for controlling horizontal scanning timing based on the synchronization signal. The controller 12 supplies the vertical scanning control signal and the horizontal scanning control signal to the scanning line drive circuit 14 and the signal line drive circuit 15, and supplies a digital video signal digital video signal to the signal line drive circuit 15 in synchronization with the vertical and horizontal scanning timing.

The scanning line drive circuit 14 includes a shift register, an output buffer, and so forth, and sequentially transfers a horizontal scanning start pulse supplied from the outside to the next step to supply two kinds of control signals, i.e., the control signals SG, BG. Thereby, the first scanning line Sga (1-*m*) and the second scanning line Sgb (1-*m*) are driven by the control signals SG (1-*m*) and BG (1-*m*), respectively, in different horizontal scanning periods.

The signal line drive circuit 15 converts video signals sequentially provided by controlling the horizontal scanning control signals in the horizontal scanning periods into an analog form to obtain voltage signals, and supplies the voltage signals to a plurality of video signal lines X (1-*n*) in parallel. The signal line drive circuit 15 includes voltage supplies connected to the respective video signal lines X (1-*n*), and the voltage supplies output gray-scale video voltage signals Vsig of a plurality of gradations to the video signal lines X (1-*n*) according to video signals.

The operations of each of the pixel circuits 18 are divided into a signal writing operation and a light-emitting operation.

In the signal writing operation, the control signal SG of the display pixel PX is set at an off potential at which the pixel switch SST is set to an on state, and the control signal BG is set at an off potential at which the output switch BCT is set to an off state. Thereby, the output switch BCT is turned off (non-conductive state), and the pixel switch SST is turned on (conductive state), and the signal writing operation is started.

In a video voltage signal writing period, a gray-scale video voltage signal Vsig is output from the voltage supply of the signal line drive circuit 15 to the video signal line X, and a signal potential Vsig is written to the pixel circuit 18 via the pixel switch SST. That is, the drain of the pixel switch SST is set at the Vsig potential. By writing the video voltage signal Vsig, the electrode potential of the upper electrode C1 of the storage capacitor Cs connected to the pixel switch SST is displaced to the video voltage signal Vsig, and the video signal potential is retained by the storage capacitor Cs. With this potential change, the gate potential of the drive transistor DRT becomes Vsig according to the law of conservation of charge.

After that, the control signal SG is set at an off potential (high level), and the pixel switch SST is turned off. Thereby, the video voltage signal writing operation is finished. Simultaneously with or following this, the control signal BG is set at a level (on potential) at which the output switch BCT is set to an on state. Thereby, the pixel switch SST is turned off (non-conductive state), and only the output switch BCT is turned on (conductive state), and the light-emitting operation is started.

In a light emission period, the drive transistor DRT outputs a driving current of an amount corresponding to the gate control voltage written in the storage capacitor Cs to the organic EL element 16 from the voltage power line Vdd. This driving current is supplied to the organic EL element 16 through the output switch BCT. Thereby, the organic EL element 16 emits light with a brightness according to the driving current, and performs a light-emitting operation. The organic EL element 16 maintains the light emission state until the control signal BG is set at an off potential again after a period of 1 frame.

The above-described video voltage signal writing operation and light-emitting operation are performed in each display pixel repeatedly to display a desired image.

According to the organic EL display with the above-described configuration, by providing a shield electrode between the electrode of the emitting element 16, the back electrode 44 in this case, and the gate electrode of the drive transistor DRT, and between the back electrode 44 and the upper electrode C1 of the storage capacitor Cs electrically connected to the gate electrode of the drive transistor DRT, it is possible to shield these electrodes and avoid formation of parasitic capacitance between these electrodes. A capacitor having a shielding effect is formed between the shield electrode 36 and the back electrode 44. Therefore, in comparison with a case where a shield electrode is not formed, parasitic capacitance that may occur between the electrode of the emitting element and the upper electrode and the gate electrode can be reduced. That is, parasitic capacitance between electrodes can be decreased even when the area of electrodes of the organic EL element 16 is maximized. The decrease in parasitic capacitance reduces change in potential of the electrode of the storage capacitor Cs and change in potential of the gate electrode of the drive transistor DRT caused by change in electrode potential of the emitting element 16 at the time of end of writing, which makes it possible to supply a desired current to the organic EL element 16. Thus, an organic EL display excellent in display quality can be obtained by realizing decrease in white brightness and decrease in dynamic range loss of the video signal voltage.

The present inventor researched the voltage value applied to the organic EL element 16 in the cases where a shield electrode is provided and not provided. In this research, an organic EL diode in which a threshold voltage is 2 V and the application voltage at the time of white light emission (display) is 5 V was used as the organic EL element 16. When the shield electrode was not provided, there was a loss of 100 mV in the application voltage to the organic EL device at the time of white light emission. When the shield electrode 36 was provided, this loss was equal to or less than 10 mV.

In the present embodiment, the above-described effect can be obtained when the shield electrode 36 overlaps with at least the gate electrode 32 of the drive transistor DRT or the upper electrode C1 at the potential same as that of this gate electrode. Further, in the above-described configuration, the shield electrode 36 is formed of a portion of the high-voltage voltage power line Vdd, but the present invention is not limited thereto, and the shield electrode may be formed by extending a line or an electrode which does not involve change in potential at least during light emission.

Next, an organic EL display according to the second embodiment will be described.

FIG. 5 is an equivalent circuit diagram of a display pixel of the organic EL display, and FIG. 6 is a plan view schematically illustrating the display pixel.

The second embodiment is different from the first embodiment in that a shield electrode is provided between an electrode of an organic EL element 16 and an upper electrode of a storage capacitor Cs, and connected to a storage capacity line.

As shown in FIG. 4, each display pixel PX of the organic EL display includes the organic EL element 16 including a photoactive layer between counter electrodes, and a pixel circuit 18 which supplies a driving current to this element. The pixel circuit 18 is a pixel circuit of a voltage signal scheme of controlling light emission of the organic EL element 16 according to a video signal formed of a voltage signal, and includes a pixel switch SST, a drive transistor DRT, a storage capacitor Cs as a capacitor and an output switch BCT.

The pixel switch SST, the drive transistor DRT, the output switch BCT are formed of thin-film transistors of the same conductivity type in this case, such as P-channel. The drive transistor DRT and the output switch BCT are connected in series to the organic EL element 16 between a high-voltage voltage power line Vdd and a low-voltage reference voltage power line Vss, and outputs a driving current of an amount determined according to a video signal to the organic EL device. A source of the drive transistor DRT is connected to the voltage power line Vdd, and a drain of the drive transistor DRT is connected to one of the electrodes, such as the anode, of the organic EL element 16.

A source of the output switch BCT is connected to a drain of the drive transistor DRT, a drain of the output switch BCT is connected to one of the electrodes, the anode in this case, of the organic EL element 16, and a gate of the output switch BCT is connected to the second scanning line Sgb (1-$m$). The output switch BCT is controlled to be turned on (conductive state) or off (non-conductive state) by a control signal BG (1-$m$) from the second scanning line Sgb (1-$m$), and controls the drive transistor DRT and the organic EL element 16 to be connected or disconnected.

A source of the pixel switch SST is connected to the video signal line X (1-$n$), and a drain of the pixel switch SST is connected to the gate of the drive transistor DRT. A gate of the pixel switch SST is connected to a first scanning line Sga (1-$m$), and is controlled to be turned on or off by a control signal SG (1-$m$) supplied from the first scanning line Sga (1-$m$). In response to the control signal SG (1-$m$), the pixel switch SST controls the pixel circuit 18 and the video signal line X (1-$n$) to be connected or disconnected, and captures a gray-scale video voltage signal to the pixel circuit 18 from a corresponding video signal line X (1-$n$).

The storage capacitor Cs has a pair of plate-shaped upper electrode C1 and lower electrode C2 facing each other with an insulating layer interposed therebetween. The upper electrode C1 is connected to a gate of the drive transistor DRT, and the lower electrode C2 is connected to a third scanning line (storage capacity line) Sgc (1-$m$). The storage capacitor Cs retains a gate control potential of the drive transistor determined by a video signal written through the pixel switch SST. A control signal Sb (1-$m$) at a constant potential is applied to the storage capacity line Sgc (1-$m$).

Next, a deposition structure and a deposition pattern of the display pixel PX will be described in detail. As shown in FIG. 6, a channel layer of each of the pixel switch SST, the drive transistor DRT, the output switch BCT, and the lower electrode C2 of the storage capacitor Cs are formed on the undercoat layer formed on the substrate of the display panel. Each of the channel layers, a channel layer 22 of the pixel switch SST, for example, includes a source region 22$a$, a drain region 22$b$, and a channel region 22$c$ located between the source and drain regions. Similarly, a channel layer 24 of the drive transistor DRT includes a source region 24$a$, a drain region, and a channel region 24$c$ located between the source and drain regions. The lower electrode C2 of the storage capacitor Cs is an n$^+$ polysilicon layer, for example.

A gate insulating film is formed on the channel layers and the lower electrode C2. On the gate insulating film 26, the first scanning line Sga (1-$m$), the second scanning line Sgb (1-$m$), and the third scanning line (storage capacity line) Sgc (1-$m$), which are formed of MoW, for example, and the upper electrode C1 of the storage capacitor Cs are formed.

The upper electrode C1 is arranged to face most of the lower electrode C2 interposing the gate insulating film, i.e., leaving a clearance. The upper electrode C1, the lower electrode C2 and the gate insulating film interposed therebetween forms the storage capacitor Cs. An end of the upper electrode C1 extends over the channel region 24$c$ of the drive transistor DRT to form the gate electrode 32 of the drive transistor DRT.

An interlayer insulating film is formed on the gate insulating film, the first scanning line Sga (1-$m$), the second scanning line Sgb (1-$m$) and the upper electrode C1. On the interlayer insulating film, the video signal line X (1-$n$), the voltage power line Vdd as the first power wiring, the reference voltage power line Vss as the second power wiring, and a shield electrode 36 are formed. These have a three-layered structure of Mo/Al/Mo, for example.

Each video signal line X (1-n) is connected to the source region 22a of the pixel switch SST. The drain of the pixel switch SST is connected to the upper electrode C1 of the storage capacitor Cs. The lower electrode C2 of the storage capacitor Cs is connected to the storage capacity line Sgc via a contact hole. The voltage power line Vdd is partially connected to the source region 24a of the drive transistor DRT via a contact hole.

The shield electrode 36 is arranged on most of the upper electrode C1 of the storage capacitor Cs, and faces the upper electrode C1 interposing the interlayer insulating layer. In the present embodiment, the shield electrode 36 is connected to the storage capacity line Sgc, and can be set at a constant potential common to the shield electrode 36 and the storage capacity line Sgc.

The voltage power line Vdd, the reference voltage power line Vss, and the shield electrode 36 are coated with a passivation film. A plurality of organic EL elements 16 are formed on the passivation film. Each of the organic EL elements 16 has a back electrode 44 formed on the passivation film and having light reflectivity, for example. The back electrode 44 forms the anode of the organic EL element 16, for example. The back electrode 44 is formed on the shield electrode 36, the storage capacitor Cs, the drive transistor, the output switch BCT, and the first, second and third scanning lines Sga, Sgb, Sgc over a wide range between the video signal line X and the voltage power line Vdd. The back electrode 44 is connected to the drain of the output switch BCT through a contact hole formed in the passivation film.

As in the first embodiment, an organic light-emitting layer including a luminescent organic compound which emits red, green or blue, for example, is formed on an approximately entire surface of the back electrode 44, and a front electrode is formed on the organic light-emitting layer. In this example, the front electrode is formed as an electrode connected to which a plurality of display pixels PX are connected, i.e., as a common electrode, and forms the anode of the emitting element 16. The front electrode is formed of a transparent conductive material such as ITO, and has optical transparency. The front electrode is electrically connected to the reference voltage power line Vss via a contact hole formed in the passivation film, for example.

In the second embodiment, other configurations of the display pixel are the same as those of the above-described first embodiment, and the same structural elements will be denoted by the same reference numerals to omit detailed descriptions thereof.

According to the organic EL display with the above-described configuration, by providing the shield electrode 36 between the back electrode 44 and the upper electrode C1 of the storage capacitor Cs electrically connected to the gate electrode 32 of the drive transistor DRT, a capacitor having a shielding effect is formed between the shield electrode 36 and the back electrode 44 and these electrodes C1 and 44 are shielded, and parasitic capacitance can be prevented from being formed between these electrodes. Therefore, parasitic capacitance between the electrode of the emitting element and the upper electrode can be decreased even when the area of the electrode of the organic EL element 16 is maximized. The decrease in parasitic capacitance reduces change in potential of the electrode of the storage capacitor Cs and change in potential of the gate electrode of the drive transistor DRT caused by change in electrode potential of the emitting element 16 at the time of end of writing, which allows a desired current to be supplied to the organic EL element 16. Thereby, and an organic EL display excellent in display qualities can be obtained by realizing decrease in white brightness and decrease in dynamic range loss of the video signal voltage can be realized.

Next, an organic EL display according to the third embodiment will be described.

FIG. 7 is an equivalent circuit diagram of the display pixel of the organic EL display, and FIG. 8 is a plan view of schematically illustrating the display pixel. The third embodiment is different from the second embodiment in that the output switch BCT and the second scanning line which controls the output switch to be turned on or off are omitted.

As shown in FIG. 7, a display pixel PX of the organic EL display includes an organic EL element 16, and a pixel circuit 18 which supplies a driving current to the organic EL element 16. The pixel circuit 18 is a pixel circuit of a voltage signal scheme of controlling light emission of the organic EL element 16, and comprises a pixel switch SST, a drive transistor DRT, a storage capacitor Cs as a capacitor, and a shield electrode 36.

The pixel switch SST and the drive transistor DRT are formed of P-channel thin-film transistors, for example. The drive transistor DRT is connected in series to the organic EL element 16 between a high-voltage voltage power line Vdd and a low-voltage reference voltage power line Vss, and outputs a driving current of an amount determined according to a video signal to the organic EL device. A source of the drive transistor DRT is connected to the voltage power line Vdd, and a drain of the drive transistor DRT is connected to one of the electrodes, such as the anode, of the organic EL element 16.

A source of the pixel switch SST is connected to the video signal line X (1-n), and a drain of the pixel switch SST is connected to the gate of the drive transistor DRT. The gate of the pixel switch SST is connected to the first scanning line Sga (1-m), and controlled to be turned on or off by a control signal SG (1-m) supplied from the first scanning line Sga (1-m).

The storage capacitor Cs has a pair of plate-shaped upper electrode C1 and lower electrode C2 facing each other with an insulating layer interposed therebetween. The upper electrode C1 is connected to the gate of the drive transistor DRT, and the lower electrode C2 is connected to a third scanning line (storage capacity line) Sgc (1-m). The storage capacitor CS retains a gate control potential of the drive transistor determined by a video signal written through the pixel switch SST. A control signal Sb (1-m) at a constant potential is applied to the storage capacity line Sgc (1-m).

As shown in FIG. 8, the upper electrode C1 is arranged to face most of the lower electrode C2, interposing the gate insulating film, i.e., leaving a clearance. The upper electrode C1, the lower electrode C2, and the gate insulating film interposed therebetween forms the storage capacitor Cs. An end of the upper electrode C1 extends over the channel region 24c of the drive transistor DRT, and forms a gate electrode 32 of the drive transistor DRT.

The shield electrode 36 is arranged on most of the upper electrode C1 of the storage capacitor Cs, and faces the upper electrode C1 interposing the interlayer insulating layer. In the present embodiment, the shield electrode 36 is connected to the storage capacity line Sgc, and can be set at a potential common to the shield electrode 36 and the storage capacity line Sgc. The voltage power line Vdd, the reference voltage power line Vss, and the shield electrode 36 are coated with a passivation film.

A plurality of organic EL elements 16 are formed on the passivation film.

Each of the organic EL elements 16 has a back electrode 44 formed on the passivation film and having light reflectivity, for example. The back electrode 44 forms the anode of the organic EL element 16, for example. The back electrode 44 is formed on the shield electrode 36, the storage capacitor Cs, the drive transistor, and the first, second and third scanning lines Sga, Sgb, Sgc over a wide range between the video signal line X and the voltage power line Vdd. The back electrode 44 is connected to the drain of the output switch BCT via a contact hole formed in the passivation film.

As in the first embodiment, an organic light-emitting layer including a luminescent organic compound which emits red, green or blue, for example, is formed on an approximately entire surface of the back electrode 44, and the front electrode is formed on the organic light-emitting layer. The front electrode is formed as an electrode to which a plurality of display pixels are connected, i.e., as a common electrode, and forms an anode of the emitting element 16. The front electrode is formed of a transparent conductive material such as ITO, for example, and has optical transparency. The front electrode is electrically connected to the reference voltage power line Vss via a contact hole formed in the passivation film, for example.

In the third embodiment, other configuration of the display pixel are the same as those of the above-described second embodiment, and the same structural elements will be denoted by the same reference numerals to omit detailed descriptions thereof. The organic EL display with the above-described configuration obtains the same advantageous effect as can be obtained by the above-described second embodiment.

Next, an organic EL display according to the fourth embodiment will be described.

Figure 9:
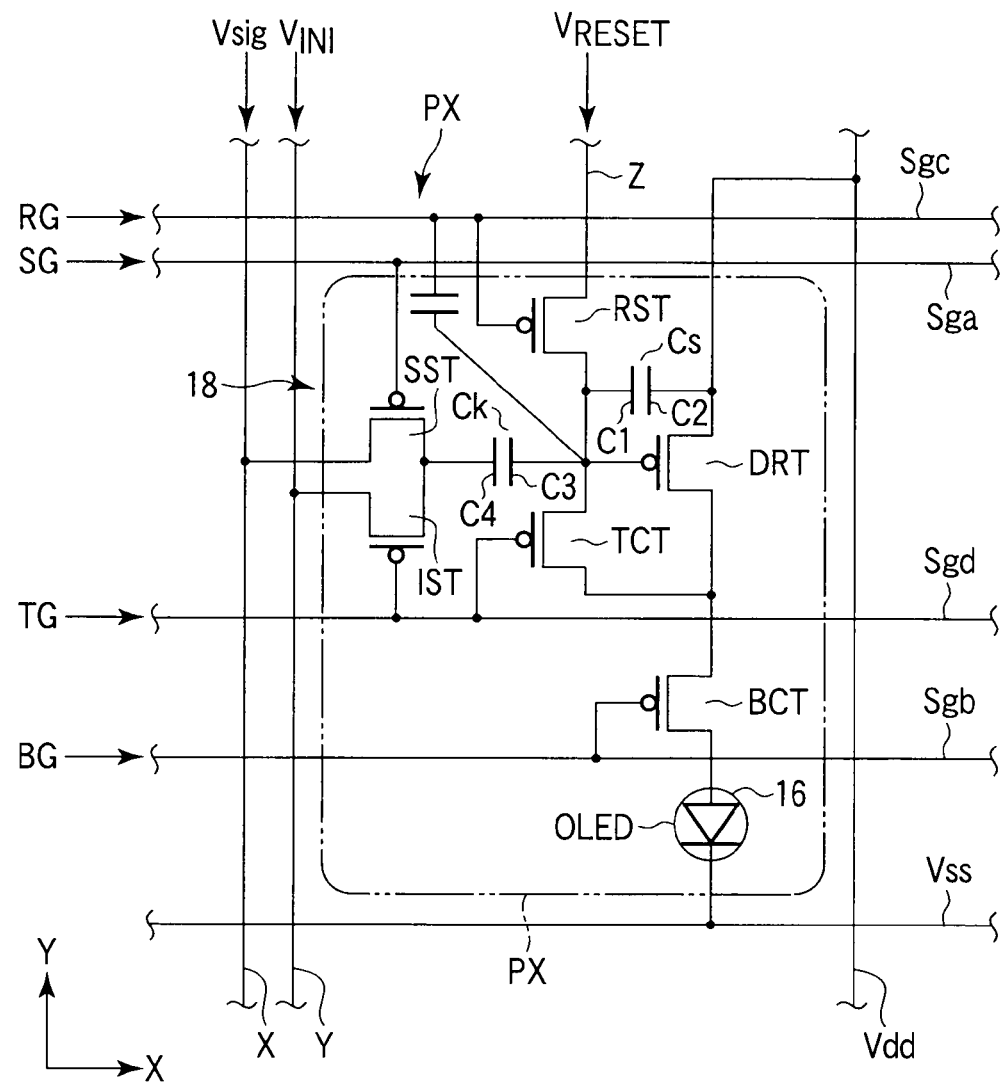
FIG. 9 is an equivalent circuit diagram of a display pixel of an organic EL display according to a fourth embodiment of the present invention.
Figure 10:
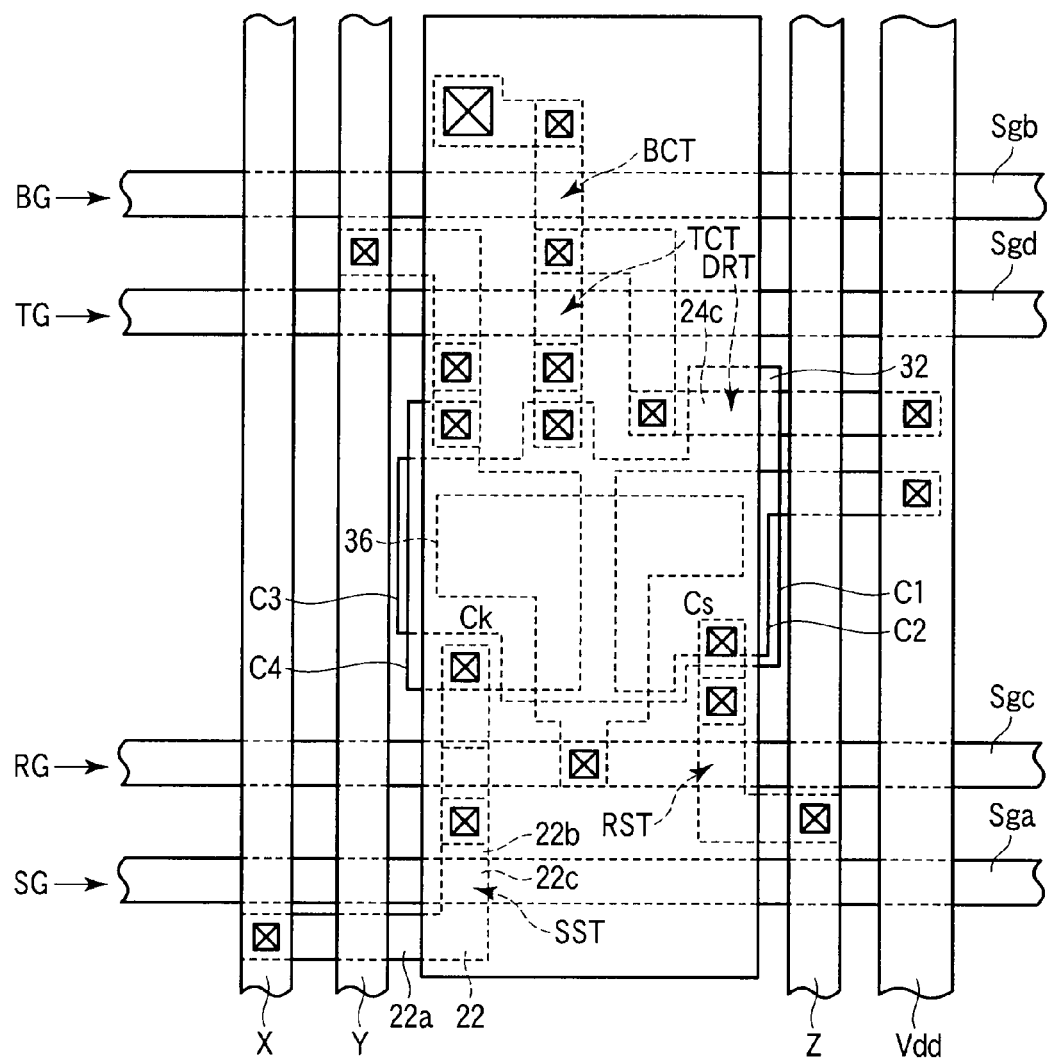
FIG. 10 is a plan view schematically illustrating a display pixel of the organic EL display according to the fourth embodiment.

FIG. 9 is an equivalent circuit diagram of a display pixel of the organic EL display, and FIG. 10 is a plan view schematically illustrating the display pixel.

The fourth embodiment is different in circuit configuration from the above-described embodiments in that the display pixel of the organic EL display is provided with functions of initialization and reset of a drive transistor. Further, shield electrodes are arranged on electrodes of first and second storage capacitors, and electrically connected to a reset control line.

As shown in FIG. 9, an organic EL panel of the organic EL display is arranged as a matrix on an insulating substrate, and comprises m first scanning lines (gate wiring for controlling signal writing) Sga (1-*m*), m second scanning lines (gate wiring for controlling EL light emission) Sgb (1-*m*), m reset control lines Sgc (1-*m*), and m cancellation control lines Sgd (1-*m*), which are connected to the respective lines of the display pixels and provided independently, and n video signal lines X (1-*n*) connected to the respective rows of the display pixels PX, n video reference potential lines Y (1-*n*) connected to the respective lines of the display pixels PX, and n reset potential lines Z (1-*n*).

The organic EL panel comprises a scanning line drive circuit, not shown, which sequentially drives the first and second scanning lines Sga (1-*m*), Sgb (1-*m*), the reset control line Sgc (1-*m*), and the cancellation control line Sgd (1-*m*) according to the rows of the display pixels PX, and a signal line drive circuit, not shown, which drives a plurality of video signal lines X, a plurality of video reference potential lines Y (1-*n*), and reset potential lines Z (1-*n*). The scanning line drive circuit and the signal line drive circuit are integrally formed on the insulating substrate outside of a display region, and forms a control unit together with the controller.

Each of the display pixels PX comprises an emitting element including a photoactive layer between counter electrodes and a pixel circuit 18 which supplies a driving current to the emitting element. The emitting element is a self-luminous device, for example, and the present embodiment uses the organic EL element 16 comprising at least an organic light-emitting layer as the photoactive layer.

The pixel circuit 18 is a pixel circuit of a voltage signal scheme of controlling light emission of the organic EL element 16 according to the video signal formed of a voltage signal, and comprises a pixel switch SST, a drive transistor DRT, a first switch TCT, first and second storage capacitors Cs and CK as capacitors, an output switch BCT, an initialization switch IST, and a reset switch RST.

The pixel switch SST, the drive transistor DRT, the first switch TCT, the output switch BCT, the initialization switch IST, and the reset switch RST are formed of thin-film transistors of the same conductive type in this case, such as P-channel type. In the present embodiment, all the drive transistors and thin-film transistors forming the switches are formed by the same process with the same laminar structure, and are thin-film transistors with a top-gate structure using polysilicon in semiconductor layers.

Each of the pixel switch SST, the drive transistor DRT, the first switch TCT, the output switch BCT, the initialization switch IST, and the reset switch RST includes a first terminal, a second terminal and a control terminal, and the present embodiment refers the first terminal, the second terminal, and the control terminal to a source, a drain, and a gate, respectively.

In the pixel circuit 18, the drive transistor DRT and the output switch BCT are connected in series to the organic EL element 16 between a high-voltage voltage power line Vdd and a low-voltage reference voltage power line Vss, and outputs a driving current of an amount determined according to a video signal to the organic EL element 16. A source of the drive transistor DRT is connected to the voltage power line Vdd, and a drain of the drive transistor DRT is connected to an electrode, such as the anode, of the organic EL element 16. The voltage power line Vdd and the reference voltage power line Vss are set to potentials of +5V and −3V, respectively, for example. The voltage power line Vdd and the reference voltage power line Vss are connected to a signal line drive circuit, and receives a power voltage supplied from the signal line drive circuit.

A source of the output switch BCT is connected to the drain of drive transistor DRT, and a drain of the output switch BCT is connected to one of the electrodes, the anode in this case, of the organic EL element 16, and a gate of the output switch BCT is connected to the second scanning line Sgb (1-*m*). The output switch BCT is controlled to be turned on (conductive state) or off (non-conductive state) by a control signal BG (1-*m*) from the second scanning line Sgb (1-*m*), and the drive transistor DRT and the organic EL element 16 are controlled to be connected or disconnected. A source of the pixel switch SST is connected to the video signal line X (1-*n*), and a drain of the pixel switch SST is connected to the gate of the drive transistor DRT via the second storage capacitor Ck. A gate of the pixel switch SST is connected to the first scanning line Sga (1-*m*), and is controlled to be turned on or off by the control signal SG (1-*m*) supplied from the first scanning line Sga (1-*m*). In response to the control signal SG (1-*m*), the pixel switch SST controls the pixel circuit 18 and the video signal line X (1-*n*) to be connected or disconnected, and captures a gray-scale video voltage signal to the pixel circuit 18 from a corresponding video signal line X (1-*n*).

The first switch TCT is connected between the drain of the drive transistor DRT and the drain of the pixel switch SST, and the gate of the first switch TCT is connected to the cancellation control line Sgd (1-$m$). The first switch TCT is controlled to be turned on (conductive state) or off (non-conductive state) according to the control signal TG (1-$m$) from the cancellation control line Sgd (1-$m$), and controls the drain of the drive transistor DRT and the drain of the pixel switch SST to be connected or disconnected. Further, the first switch TCT regulates a current leak from the first storage capacitor Cs and the second storage capacitor Ck.

The first storage capacitor Cs includes plate-shaped upper electrode C1 and lower electrode C2 facing each other interposing an insulating layer therebetween, is connected between the voltage power line Vdd and the drive transistor DRT, and retains a gate control potential of the drive transistor determined by the video signal.

The second storage capacitor Ck includes plate-shaped upper electrode C3 and lower electrode C4 facing each other with an insulating layer interposed therebetween, is connected between thr gate of the drive transistor DRT and the pixel switch SST, and changes the gate potential of the drive transistor DRT according to a video signal. That is, the video signal is transmitted to the gate potential of the drive transistor DRT via the second storage capacitor Ck according to the law of conservation of charge. Further, the second storage capacitor Ck retains the gate control potential of the drive transistor DRT determined by the video signal together with the first storage capacitor Cs.

A source of the initialization switch IST is connected to the video reference potential line Y (1-$n$), and a drain of the initialization switch IST is connected between the drain of the pixel switch SST and the lower electrode C4 of the second storage capacitor Ck. The gate of the initialization switch IST is connected to the cancellation control line Sgd (1-$m$), and the initialization switch IST is turned on (conductive state) or off (non-conductive state) according to the control signal TG (1-$m$) from the cancellation control line Sgd (1-$m$), supplies an initialization reset voltage signal VINI to the pixel circuit 18 from a corresponding video reference potential line Y (1-$n$), and retains the potential of one of the electrodes, the lower electrode C4 opposite to the drive transistor DRT in this case, of the second storage capacitor Ck, to a constant value (VINI). That is, the initialization switch IST is turned on or off according to the control signal TG (1-$m$) from the cancellation control line Sgd (1-$m$), and previous frame information of the drain potential of the pixel switch SST is initialized.

The source of the reset switch RST is connected to a reset potential line Z (1-$n$), a drain of the reset switch RST is connected between the gate of drive transistor DRT and the second storage capacitor Ck, and the gate of the reset switch RST is connected to the reset control line Sgc (1-$m$). The reset switch RST is turned on (conductive state) or off (non-conductive state) according to the control signal RG (1-$m$) from the reset control line Sgc (1-$m$), supplies the reset voltage signal VRESET to the pixel circuit 18 from a corresponding reset potential line Z (1-$n$), and sets the gate potential of the drive transistor DRT at a VRESET potential every 1 vertical period. That is, the reset switch RST is turned on or off according to the control signal RG from the reset control line Sgac, and information on the previous frame, which is the gate potential of the drive transistor DRT, is initialized.

Next, a deposition structure and a deposition pattern of the display pixel PX will be described. As shown in FIG. 10, a channel layer of each of the pixel switch SST, the drive transistor DRT, the output switch BCT, the initialization switch IST, the reset switch RST, the first switch TCT, the lower electrode C2 of the first storage capacitor Cs and the lower electrode C4 of the second storage capacitor Ck is formed on the undercoat layer formed on the substrate of the display panel. Each of the channel layers, such as the channel layer 22 of the pixel switch SST, for example, has a source region 22$a$, a drain region 22$b$, and a channel region 22$c$ located between the source and drain regions. Similarly, the channel layer of the drive transistor DRT has source region, a drain region, and a channel region 24$c$ located between the source and drain regions. The lower electrode C2 of the first storage capacitor Cs, and the lower electrode C4 of the second storage capacitor Ck are formed of n+ type polysilicon layers, for example.

A gate insulating film is formed on the channel layer and the lower electrodes C2, C4. The first scanning line Sga (1-$m$), the second scanning line Sgb (1-$m$), the reset control line Sgc (1-$m$), the cancellation control line Sgd (1-$m$), the upper electrode C1 of the first storage capacitor Cs, and the upper electrode C3 of the second storage capacitor Ck, which are formed of MoW, for example, are formed on the gate insulating film.

The upper electrode C1 is arranged to face most of the lower electrode C2 interposing a gate insulating film, i.e., leaving a clearance. The upper electrode C1, the lower electrode C2, and the gate insulating film interposed therebetween forms the first storage capacitor Cs. An end of the upper electrode C1 extends over the channel region 24$c$ of the drive transistor DRT, and forms the gate electrode 32 of the drive transistor DRT.

The upper electrode C3 of the second storage capacitor Ck is arranged to face most of the lower electrode C4 interposing a gate insulating film, i.e., leaving a clearance. The upper electrode C3, the lower electrode C4, and the gate insulating film interposed therebetween form the second storage capacitor Ck. In the present embodiment, the upper electrodes C1, C3 of the first and second storage capacitors Cs, Ck are formed of a common electrode.

An interlayer insulating film is formed on the gate insulating film, the first scanning line Sga (1-$m$), the second scanning line Sgb (1-$m$), the control line, and the upper electrodes C1, C3. The video signal line X (1-$n$), the voltage power line Vdd as the first power wiring, the reference voltage power line Vss as the second power wiring, the video reference potential line Y (1-$n$), the reset potential line Z (1-$n$), and the shield electrode 36 are formed on the interlayer insulating film. These have a three-layered structure of Mo/Al/Mo, for example.

The shield electrode 36 is arranged on most of the upper electrodes C1, C3 of the first and second storage capacitors Cs, Ck, and faces the upper electrode C1, C3, with an interlayer insulating layer interposed therebetween. In the present embodiment, the shield electrode 36 is electrically connected to the reset control line Sgc, and is set to a potential common to the shield electrode 36 and the reset control line Sgc. The reset control line Sgc changes its potential to off, on, and off during the reset operation, but is fixed at a constant potential from writing of a video signal to a light-emitting period.

The voltage power line Vdd, the reference voltage power line Vss, and the shield electrode 36 are coated with a passivation film. A plurality of organic EL elements 16 are formed on the passivation film. Each of the organic EL elements 16 has a back electrode 44 formed on the passivation film and having light reflectivity, for example. The back electrode 44 forms the anode of the organic EL element 16, for example. The back electrode 44 is formed on the shield electrode 36, the first storage capacitor Cs, the second storage capacitor Ck, the drive transistor, and the output switch BCT over a wide range between the video signal line X and the voltage power line Vdd. The back electrode 44 is connected to the drain of the output switch BCT via a contact hole formed in the passivation film.

As in the first embodiment, an organic light-emitting layer including a luminescent organic compound which emits red, green or blue, for example, is formed on an approximately entire surface of the back electrode 44, and a front electrode is formed on the organic light-emitting layer. In this example, the front electrode is formed as an electrode to which a plurality of display pixels PX are connected, that is, as a common electrode, and forms an anode of the emitting element 16. The front electrode is formed of a transparent conductive material, such as ITO, and has optical transparency. The front electrode is electrically connected to a reference voltage power line Vss through a contact hole formed in the passivation film, for example.

In the fourth embodiment, other configuration of the display pixel PX are the same as those of the above-described first embodiment, and the same structrual elements will be denoted by the same reference numerals to omit detailed descriptions of such elements.

According to the organic EL display with the above-described configuration, by providing the shield electrode 36 between the back electrode 44 and the upper electrodes C1, C3 of the first and second storage capacitors Cs, Ck electrically connected to the gate electrode 32 of the drive transistor DRT, a capacitor having a shielding effect is formed between the shield electrode 36 and the back electrode 44 and these electrodes 44 and C1, C3 can be shielded. Thus, parasitic capacitance can be prevented from being formed between the electrodes 44 and C1, C3. Therefore, parasitic capacitance between the electrode of the emitting element and the upper electrode can be decreased even when the electrode area of the organic EL element 16 is maximized. The decrease in parasitic capacitance reduces change in potential of the electrode of the storage capacitor Cs and change in potential of the gate electrode of the drive transistor DRT caused by change in electrode potential of the emitting element 16 at the time of end of writing, and a desired current can be supplied to the organic EL element 16. Thereby, an organic EL display excellent in display qualities can be obtained by realizing decrease in white brightness and decrease in dynamic range loss of the video signal voltage.

The present invention is not limited directly to the embodiment described above, and its components may be embodied in modified forms without departing from the scope or spirit of the invention. Further, various inventions may be made by suitably combining a plurality of components described in connection with the foregoing embodiment. For example, some of the components according to the foregoing embodiment may be omitted. Furthermore, components according to different embodiments may be combined as required.

For example, the drive transistor DRT, the output switch BCT and the pixel switch SST may be formed of n-channel transistors as well as p-channel transistors. The present invention is not limited to organic EL displays and is also applicable to other active matrix displays.

What is claimed is:

1. An active matrix display comprising:
   a substrate;
   a video signal line formed on the substrate and extending in a first direction;
   a control line provided on the substrate and extending in a second direction perpendicular to the first direction;
   an self-emitting element including two display electrodes facing each other;
   a drive transistor connected to one of the display electrodes of the self-emitting element and having a gate electrode arranged under the display electrode connected to the drive transistor;
   a storage capacitor having a first electrode connected to the gate electrode of the drive transistor and arranged under the display electrodes, and a second electrode facing the first electrode interposing an insulating layer;
   an output switch connected between the drive transistor and the self-emitting element, and configured to control light emission of the self-emitting element, and wherein the control line includes a light emission control line connected to the output switch and configured to turn on or off the output switch; and
   a shield electrode arranged between the display electrode connected to the drive transistor and the capacitor with interposing an insulating layer, and connected to the light emission control line.

2. The active matrix display according to claim 1, wherein the self-emitting element includes an organic light-emitting layer interposed between the two display electrodes.

3. The active matrix display according to claim 2, wherein the self-emitting element is configured to emit light toward a side opposite to a side of the substrate.

4. The active matrix display according to claim 3, wherein one of the two display electrodes of the self-emitting element is provided on the side of the substrate and faces the shield electrode interposing an insulating layer, and the other display electrode is provided on a side opposite to the substrate with respect to said one of the display electrodes and has optical transparency.

* * * * *